(12) United States Patent
Kleiman et al.

(10) Patent No.: US 10,084,106 B2
(45) Date of Patent: Sep. 25, 2018

(54) AREAL CURRENT MATCHING OF TANDEM SOLAR CELLS

(75) Inventors: Rafael Kleiman, Hamilton (CA); Jingfeng Yang, Calgary (CA)

(73) Assignee: McMaster University, Ontario (CA)

( * ) Notice: Subject to any disclaimer, the term of this patent is extended or adjusted under 35 U.S.C. 154(b) by 0 days.

(21) Appl. No.: 14/115,128

(22) PCT Filed: Apr. 30, 2012

(86) PCT No.: PCT/CA2012/050275
§ 371 (c)(1),
(2), (4) Date: Jan. 24, 2014

(87) PCT Pub. No.: WO2012/149650
PCT Pub. Date: Nov. 8, 2012

(65) Prior Publication Data
US 2014/0158189 A1    Jun. 12, 2014

Related U.S. Application Data

(60) Provisional application No. 61/481,472, filed on May 2, 2011.

(51) Int. Cl.
*H01L 31/0725* (2012.01)
*H01L 31/078* (2012.01)

(52) U.S. Cl.
CPC ........ *H01L 31/0725* (2013.01); *H01L 31/078* (2013.01); *Y02E 10/50* (2013.01)

(58) Field of Classification Search
CPC .. H01L 31/075; H01L 31/0735; H01L 31/074
See application file for complete search history.

(56) References Cited

U.S. PATENT DOCUMENTS

| | | | |
|---|---|---|---|
| 5,223,043 A | 6/1993 | Olson et al. | |
| 6,278,054 B1 * | 8/2001 | Ho et al. | 136/256 |

(Continued)

FOREIGN PATENT DOCUMENTS

| | | |
|---|---|---|
| EP | 0 848 433 A2 | 6/1998 |
| WO | 01/20686 | 3/2001 |

OTHER PUBLICATIONS

International Search Report and Written Opinion dated Aug. 27, 2012 for International Application No. PCT/CA2012/050275.

*Primary Examiner* — Bethany L Martin
(74) *Attorney, Agent, or Firm* — Quarles & Brady LLP (57) ABSTRACT

A tandem solar cell includes a bottom solar cell having an energy bandgap with $E_{g1}$ and at least a top solar cell having an energy bandgap $E_{g2}$, the energy bandgaps satisfying a relationship $E_{g1}<E_{g2}$. The bottom and top solar cells are vertically stacked and electrically interconnected in series in which an area of the bottom solar cell is larger than an area of the top solar cell in an appropriate ratio to provide for a substantially current matched photovoltaic device for operation in a 2-terminal configuration. This tandem structure may contain more than two (2) cells and each cell may be composed of more than one solar cell. In this case the top solar cell has the largest bandgap, the bottom solar cell has the smallest bandgap, and intervening solar cells have intermediate bandgaps that descend in magnitude from the top to the bottom solar cell.

12 Claims, 7 Drawing Sheets

(56) References Cited

U.S. PATENT DOCUMENTS

2004/0079408 A1* 4/2004 Fetzer et al. .................. 136/262
2006/0144435 A1* 7/2006 Wanlass ........................ 136/249
2006/0162767 A1* 7/2006 Mascarenhas et al. ....... 136/261
2010/0096001 A1* 4/2010 Sivananthan et al. ........ 136/249
2011/0017257 A1* 1/2011 Lee et al. ...................... 136/244

* cited by examiner

Bandgaps $Eg_{1.1} < Eg_{1.2} < Eg_{2.1} < Eg_{2.2} < Eg_{3.1} < Eg_{3.2}$

Figure 8

Bandgaps $Eg_1 < Eg_2$

Figure 9

Bandgaps $Eg_1<Eg_2<Eg_3$

Figure 10

Bandgaps $Eg_1<Eg_2<Eg_3$

Figure 11

AREAL CURRENT MATCHING OF TANDEM SOLAR CELLS

CROSS REFERENCE TO RELATED U.S. PATENT APPLICATIONS

This patent application is a National Phase application claiming the benefit of No. PCT/CA2012/050275 filed on 30 Apr. 2012, in English, entitled AREAL CURRENT MATCHING OF TANDEM SOLAR CELLS, which further claims the priority benefit, U.S. Provisional Patent Application Ser. No. 61/481,472 filed on May 2, 2011 entitled AREAL CURRENT MATCHING OF TANDEM SOLAR CELLS, filed in English, the entire contents of which are incorporated herein by reference.

FIELD OF THE INVENTION

The present invention relates to tandem solar cells, and more particularly it relates to areal current matching of tandem solar cells.

BACKGROUND

Figure 1:
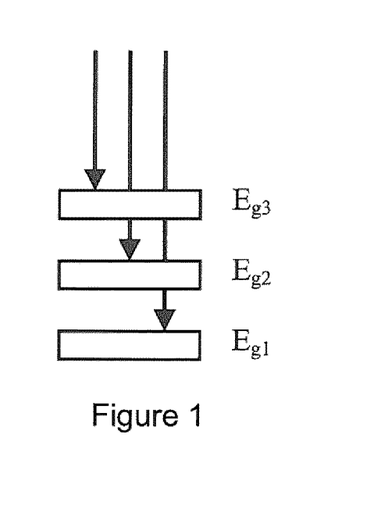
FIG. 1 shows a schematic representation of a PRIOR ART multijunction solar cell in which cells of different bandgap are stacked upon one another with the highest bandgap ($E_{g3}$) at the top and the lowest bandgap at the bottom ($E_{g1}$), such that $E_{g1} < E_{g2} < E_{g3}$.

Multijunction solar cells are a proven route to higher efficiencies than possible with single junction devices. In a multijunction solar cell, cells of different bandgap are stacked upon one another with the highest bandgap at the top and the lowest bandgap at the bottom. This is illustrated in FIG. 1, with $E_{g1}<E_{g2}<E_{g3}$. Light with $E>E_{g3}$ is absorbed in the top cell, while light with $E<E_{g3}$ passes through the top cell and impinges on the middle cell, where light with $E_{g2}<E<E_{g3}$ is absorbed and light with $E<E_{g2}$ passes through the middle cell and finally light with $E_{g1}<E<E_{g2}$ is absorbed in the bottom cell. Light with $E<E_{g1}$ is not absorbed by any of the cells.

This strategy is a method to split up the solar spectrum into parts and capture light more optimally from each part of the spectrum with 3 different cells. The same strategy can be employed with just 2 cells or with more than 3 cells. The concept of the multijunction solar cell is first described in U.S. Pat. No. 2,949,498 issued Aug. 16, 1960, entitled "Solar Energy Converter".

The stack of cells is commonly made in one of two ways. In the first method, individual cells are made separately and mechanically stacked above one another. This provides maximum flexibility in the design of the individual cells. The second and very elegant method is to grow the cells monolithically above one another (with intervening tunnel junctions for electrical connection). To achieve high performance, the cells are ideally single crystal layers (grown epitaxially) and closely lattice matched to each other.

The current state of the art cells of this type are lattice matched Ge:(InGa)As:(InGa)P, which are now commercially available and used in space and concentrator PV applications and recently have demonstrated efficiencies under concentrated light exceeding 40%. In these devices the germanium (Ge) serves as a substrate and also as the bottom cell.

In monolithic multijunction solar cells, the cells are connected in series electrically which imposes the condition that the current flowing through them in operation must be the same. Ideally and preferably the cells are "current matched" by virtue of the solar illumination and the choice of the bandgaps, if there is latitude to adjust them.

Mechanically stacked cells are often used in 3-terminal operation (for 2 cells), since current matching is not readily obtained and separate electrical operation maximizes power output without imposing current matching conditions. However this approach increases costs at the system level, since 2 inverters are required for power conversion rather than one. U.S. Pat. No. 4,575,576 issued Mar. 11, 1986 entitled "Three Junction Solar Cell" shows that appropriate series and parallel connections of the bottom and top cells of monolithically grown devices allow voltage matching configurations for sets of cells that can be used in 2-terminal operation. Similarly, U.S. Pat. No. 6,353,175 issued Mar. 5, 2002 entitled "Two-terminal Cell-interconnected-circuits using Mechanically-stacked Photovoltaic Cells for Line-focus Concentrator Arrays" shows that appropriate series and parallel connections of the bottom and top cells of mechanically stacked cells allow voltage matching configurations for sets of cells that can be used in 2-terminal operation. Voltage matched systems have some disadvantages, including the complexity of system assembly and interconnection, as well as difficulty in achieving a sufficiently accurate voltage matching configuration, because the voltages are not easily adjustable.

SUMMARY

Provided is an embodiment of a multijunction photovoltaic device comprised of two solar cells, a bottom solar cell having an energy bandgap with $E_{g1}$ and top solar cell having an energy bandgap $E_{g2}$, the energy bandgaps satisfying a relationship $E_{g1}<E_{g2}$, the bottom solar cell and the top solar cell being vertically stacked and electrically interconnected in series in which an area of the bottom solar cell is larger than an area of the top solar cell, in the appropriate ratio to provide for a substantially current matched photovoltaic device for operation in a 2-terminal configuration.

Provided is an embodiment of a multijunction photovoltaic device comprised of three solar cells, a bottom solar cell having an energy bandgap with $E_{g1}$, a middle solar cell having an energy bandgap with $E_{g2}$ and top solar cell having an energy bandgap $E_{g3}$, the energy bandgaps satisfying a relationship $E_{g1}<E_{g2}<E_{g3}$, the bottom solar cell, the middle solar cell and the top solar cell being vertically stacked and electrically interconnected in series in which an area of the bottom solar cell is largest, next followed by the middle solar cell and an area of the top solar cell is the smallest, in the appropriate ratio to provide for a substantially current matched photovoltaic device for operation in a 2-terminal configuration.

Provided is an embodiment of a multijunction photovoltaic device comprised of three solar cells, a bottom solar cell having an energy bandgap with $E_{g1}$, a middle solar cell having an energy bandgap with $E_{g2}$ and top solar cell having an energy bandgap $E_{g3}$, the energy bandgaps satisfying a relationship $E_{g1}<E_{g2}<E_{g3}$, the bottom solar cell, the middle solar cell and the top solar cell being vertically stacked and electrically interconnected in series in which an area of the bottom solar cell is largest, next followed by the top solar cell and an area of the middle solar cell is the smallest, in the appropriate ratio to provide for a substantially current matched photovoltaic device for operation in a 2-terminal configuration.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in this specification including claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately", when used in conjunction with ranges of dimensions of particles, compositions of mixtures or other physical, electrical or chemical properties or characteristics, are meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present disclosure.

The following examples are presented to enable those skilled in the art to understand and to practice embodiments of the present disclosure. They should not be considered as a limitation on the scope of the present embodiments, but merely as being illustrative and representative thereof.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

In the standard Ge:(InGa)As:(InGa)P triple junction device, the Ge cell provides excess current, due to its bandgap being lower than desirable relative to the middle (InGa)As cell and top (InGa)P cell. We have made mechanically stacked cells using (InGa)As:(InGa)P double junction devices bonded mechanically and electrically to a bottom silicon cell. The double junction cell could have also been a single junction cell and for simplicity we will refer to it as the "top cell". In this case, with silicon having a higher bandgap than Ge and somewhat higher than desirable for current matching to the top cells used, the silicon cell is the current limiting element of the device. When operated in a 2-terminal way this leads to poor efficiency, so past efforts in this direction have all utilized 3-terminal operation.

There is a known solution to promote current matching in monolithic multijunction cells, to maximize their output power under illumination. Kurtz, et a/showed in a 1990 paper (Ref. 1) that when the bottom cell limits the device current, thinning the top cell to the point that the current in the top cell is matched to the current in the bottom cell leads to optimal power conversion. In the approach described in the initial description, all light with energy greater than the bandgap is absorbed by the cell. However, by thinning the top cell, some light above its bandgap goes through to the bottom cell, decreasing the current in the top cell and increasing the current in the bottom cell, leading to current matching. In thin film devices such as the (InGa)As or (InGa)P cells, this can be accomplished by adjusting the cell thickness if required, which often requires a significant redesign of the cells. In the lattice matched Ge:(InGa)As:(InGa)P device, the Ge cell has excess current so this method is not helpful to match to its current, though there is some benefit to correctly matching the currents between the (InGa)As and (InGa)P cells. In general, whenever a cell has excess current with respect to any cell below it, an efficiency gain is possible by reducing the cell thickness.

Figure 8:
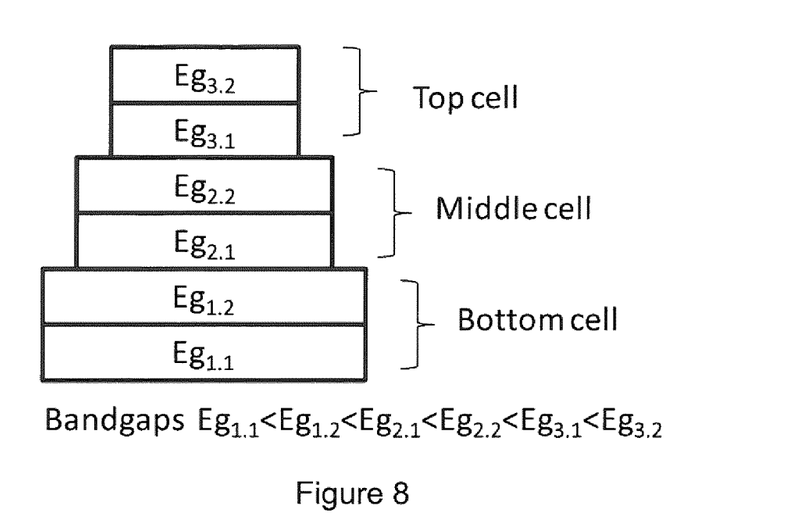
FIG. 8 shows a schematic structure of a multijunction cell where each cell has at least two subcells which have the same area as each other but different bandgaps. The decreasing areal sequence of top, middle and bottom cells is illustrated in this example.

In all embodiments herein stated, each "cell" has the same area and decreasing bandgap towards the substrate with any number of subcells. FIG. 8 shows an example of two (2) subcells for each top, middle and bottom cells where the subcells within each cell has the same area. In FIG. 8, the top, middle and bottom cells are in a sequential order of increasing cell area as an illustration purpose. Any of these subcells could limit its current.

Figure 9:
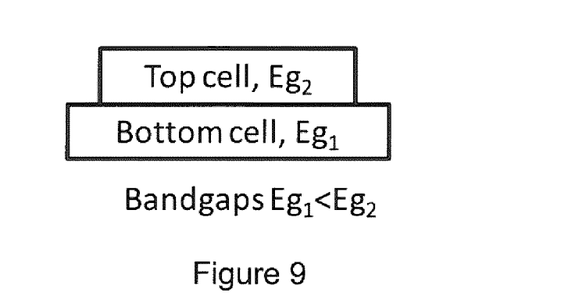
FIG. 9 shows a schematic structure of a multijunction cell which comprises a top and a bottom cell, where the bottom cell has a larger area than the top cell.

Broadly, an embodiment of a solar cell constructed in accordance with the present invention provides a multijunction photovoltaic device comprised of two (2) solar cells: a bottom solar cell having an energy bandgap with $E_{g1}$ and a top solar cell having an energy bandgap $E_{g2}$, the energy bandgaps satisfying a relationship $E_{g1}<E_{g2}$. By "top solar cell" it is meant that this is the solar cell on which light is first incident and the light enters the bottom solar cell after passing through the top solar cell, which is why the top solar cell is required to have the largest bandgap. The bottom solar cell and the top solar cell are vertically stacked and electrically interconnected in series in which an area of the bottom solar cell is larger than an area of the top solar cell in an appropriate ratio to provide for a current matched photovoltaic device for operation in a 2-terminal configuration as shown in FIG. 9.

Figure 10:
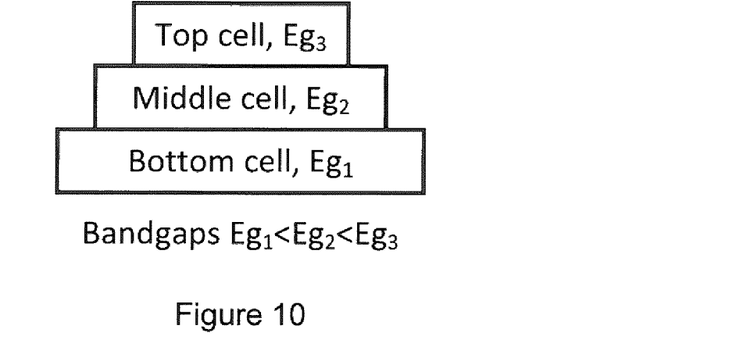
FIG. 10 shows a schematic structure of a multijunction cell which comprises a top, a middle and a bottom cell, where the bottom cell has the largest cell area, followed by the middle cell. The top cell has the smallest cell area.

An embodiment of a solar cell constructed in accordance with the present invention provides a multijunction photovoltaic device comprised of three (3) solar cells where the bottom cell has the largest cell area, next followed by the middle cell, and the top cell has the smallest cell area as in FIG. 10. In this example the bottom cell is the most current limiting, followed by the middle cell.

Figure 11:
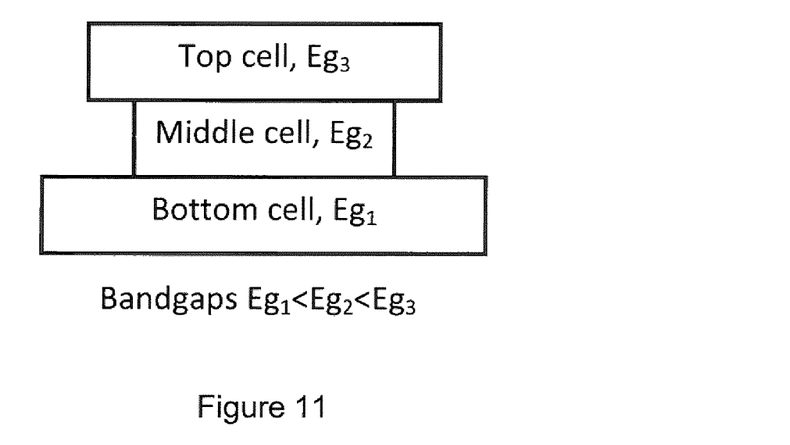
FIG. 11 shows a schematic structure of a multijunction cell which comprises a top, a middle and a bottom cell, where the bottom cell has the largest cell area, followed by the top cell. The middle cell has the smallest cell area.

An embodiment of a solar cell constructed in accordance with the present invention provides a multijunction photovoltaic device comprised of three (3) solar cells: a bottom solar cell, a middle solar cell and a top solar cell where the bottom cell has the largest cell area, next followed by top cell and the middle cell has the smallest area as in FIG. 11. In this example, the bottom cell is the most current limiting, followed by the top cell.

The present invention provides multijunction solar cell devices using advanced mechanical stacking techniques, which are also referred to as "hybrid integrated solar cells" due to the methods used in their fabrication. The inventors have made significant improvements over earlier mechanical stacking approaches. The details of these improvements are disclosed in U.S. Pat. No. 4,338,480 issued Jul. 6, 1982 entitled "Stacked multijunction photovoltaic converters", U.S. Pat. No. 4,400,868 issued Aug. 30, 1983 entitled "Method of making a transparent and electrically conductive bond", and U.S. Pat. No. 5,458,694 issued Oct. 17, 1995 entitled "Multispectral photovoltaic component comprising a stack of cells, and method of manufacture", the contents of which are incorporated herein in their entirety by reference.

Example

The present invention will now be illustrated using a non-limiting example of a tandem solar cell using mechanical stacking based on a silicon substrate with a bottom cell also in the silicon substrate. Silicon cells are substantially less expensive than Ge substrates and the higher bandgap is favourable in the design of higher efficiency solar cell devices. For reasons described above, 2-terminal operation is preferred, but not easily attained for an arbitrary choice of a top cell. For a silicon bottom cell, a top cell with a bandgap of 1.68 eV would ideally be current matched. For a bandgap higher than 1.68 eV the top cell is current limiting, while for a bandgap less than 1.68 eV the bottom (silicon) cell is current limiting.

In the silicon-based device example disclosed herein, the bottom cell is the current limiting element, so the approach described by Kurtz, eta/could be gainfully employed. However, the present inventors have devised a new approach to current matching, never previously described or utilized, which is primarily beneficial for mechanically stacked or hybrid integrated solar cells. This is referred to this as "areal current matching". Another way to allow some light to circumvent the top cell and impinge on the bottom cell is to make the top cell somewhat smaller than the bottom cell. This allows light to impinge on the bottom cell, thereby increasing its current, while simultaneously decreasing the current per unit area in the top cell (where the reference area is the bottom cell area). If the area is chosen correctly, then current matching is achieved. The inventors have demonstrated this effect and have achieved an efficiency of 25±2% for a silicon bottom solar cell and an (InGa)As:(InGa)P top solar cell.

Figure 2:
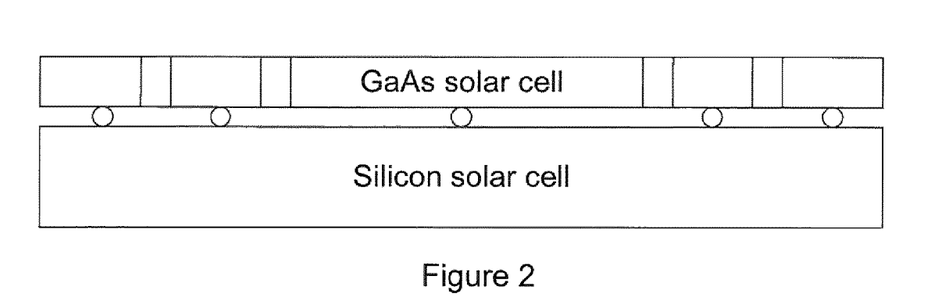
FIG. 2 shows an embodiment of an areal current matched tandem solar cell constructed in accordance with the present invention.
Figure 3:
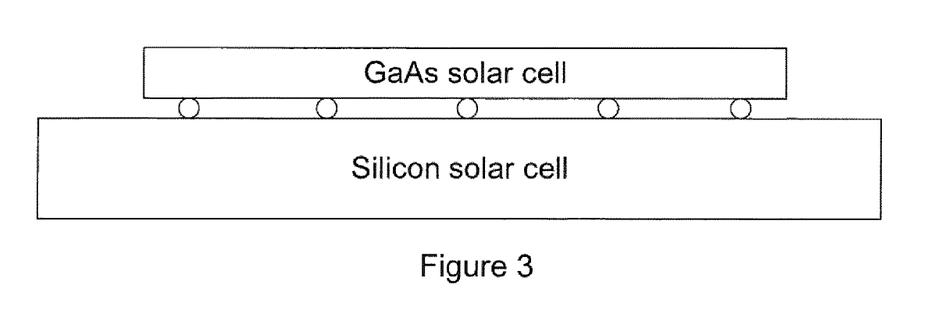
FIG. 3 shows another embodiment of an areal current matched tandem solar cell constructed in accordance with the present invention.

In one aspect, the tandem cell is comprised of a GaAs top cell and a bottom silicon cell. Mechanically stacked cells that have been made with this combination have been operated as 3-terminal devices, because the current in the silicon cell significantly limits the performance. Calculations by the inventors have shown that to optimize the cell performance, the GaAs cell should absorb about 70% of the above bandgap light and allow about 30% of the above bandgap light to pass through. Essentially the same effect is achieved by making the GaAs cell 70% of the area of the silicon cell as illustrated in FIGS. 2 and 3. Note that the larger area of the silicon cell needs to be used as the reference area for meaningful calculation of device efficiency. Note also that the exact placement of the open areas is not critical for this method to work, so either holes (as in FIG. 2), grooves or a continuous layer (as in FIG. 3) would be effective as long as all parts of the cell are connected electrically. Note that we are assuming that the GaAs cell allows all of the below bandgap light to pass through to the silicon cell below, so the GaAs cell must be sufficiently thin and/or its substrate must be highly transparent (typically by making it lightly doped).

Figure 4:
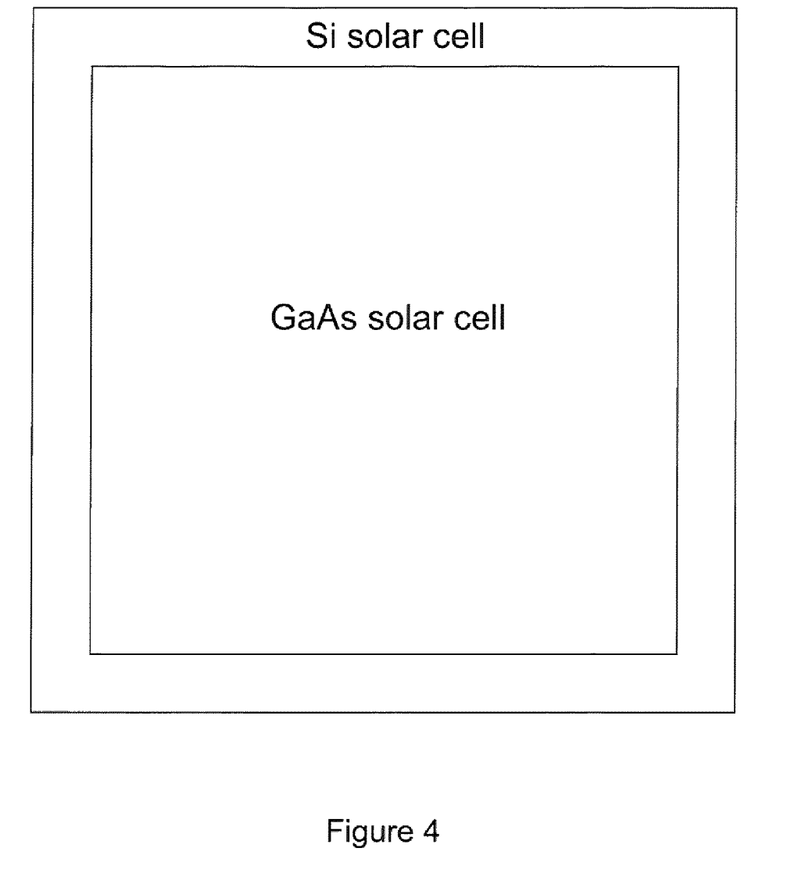
FIG. 4 is a top view of the solar cell device of FIG. 3, drawn approximately to scale which shows visually that a relatively minor adjustment in area can be used to achieve current matching.

FIG. 4 is a top view of the device of FIG. 3, drawn approximately to scale which shows visually that a relatively minor adjustment in area can be used to achieve current matching.

Figure 5:
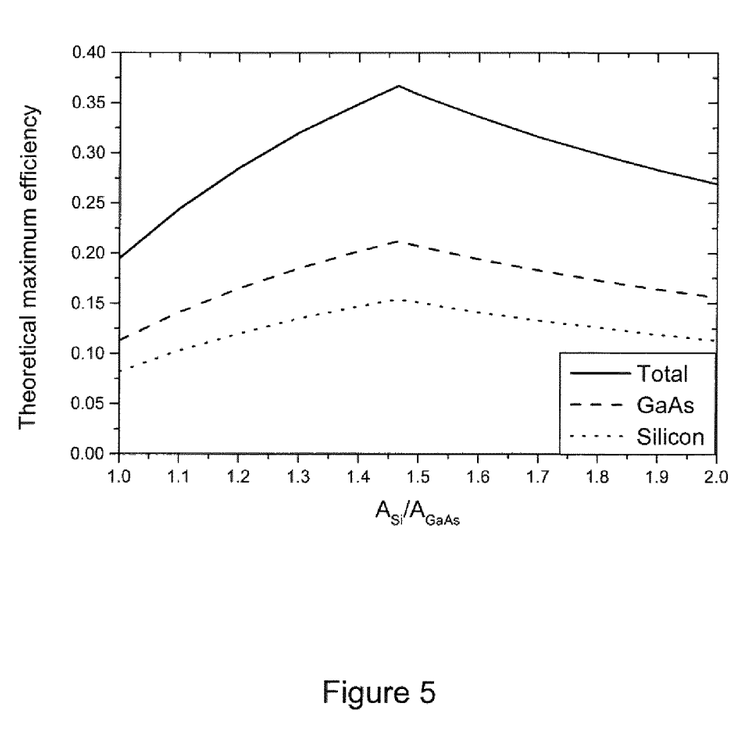
FIG. 5 is a plot which shows the theoretical maximum efficiency as a function of areal ratio for a GaAs/Si tandem cell and the relative contributions of the silicon and GaAs cells.

The inventors have also performed calculations to model the areal current matching as shown in FIG. 5. This shows that for equal cell area the performance is poor, with a theoretical maximum efficiency ~20%, lower than the theoretical maximum efficiency ~30% for either the silicon or GaAs cells used separately. It also shows a maximum performance, with a theoretical maximum efficiency ~38% when the area of the silicon cell is ~1.45 times the area of the GaAs cell, in agreement with the number expected based on 30% transmission as previously discussed.

If $N_1$ is the current density generated by photons above the silicon (bottom cell) bandgap and $N_2$ is the current density generated by photons above the GaAs (top cell) bandgap in the incident solar spectrum, then the areal ratio of bottom cell to top cell to achieve current matching is $A_{bottom}/A_{top}=2*N_2/N_1$ where $N_1 \sim 43.8$ mA/cm$^2$ and $N_2 \sim 32.0$ mA/cm$^2$, which gives $A_{bottom}/A_{top}=1.46$.

Similarly if the top cells (InGa)P and (InGa)As are current matched and of the same area, then the formula is $A_{bottom}/A_{top}=1.5*N_2/N_1$ where $N_1 \sim 43.8$ mA/cm$^2$ and $N_2 \sim 32.0$ mA/cm$^2$, which gives $A_{bottom}/A_{top}$=1.10, where we have assumed that the middle cell is GaAs to determine $N_2$. These equations can be applied to other sets of solar cells under consideration.

Figure 6:
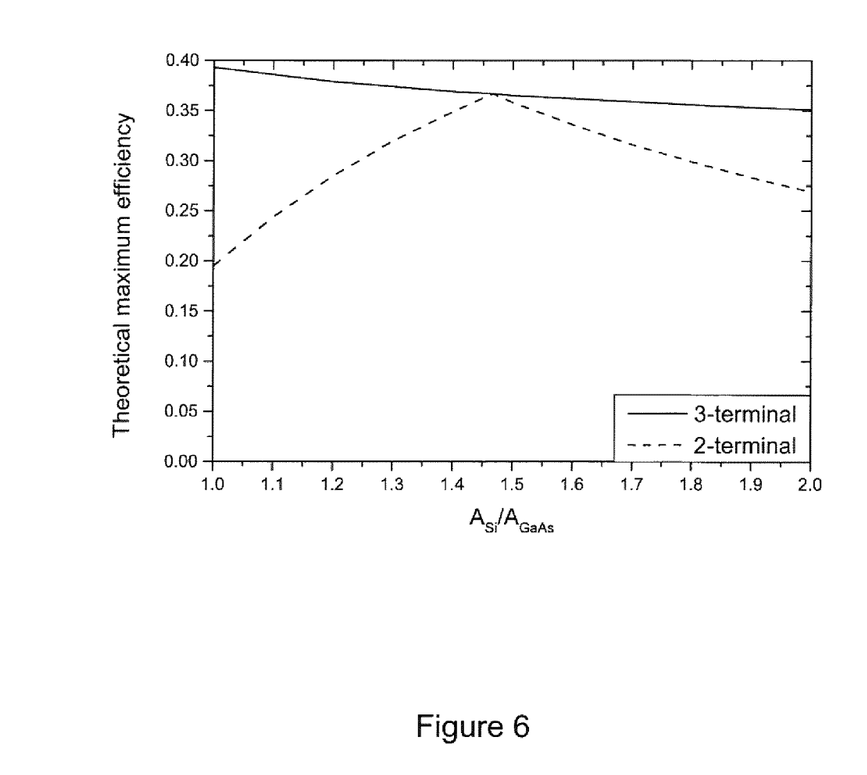
FIG. 6 is a plot which shows the theoretical maximum efficiency as a function of areal ratio for a GaAs/Si tandem cell and the comparison of theoretical maximum efficiency between 3-terminal and 2-terminal structures of a GaAs/Si tandem cell.

In FIG. 6 it is shown from calculations the result that the current matched design achieves the same performance as the 3-terminal performance for that design. Slightly better performance can be achieved in pure 3-terminal operation when the areas are identical, since both cells are more optimally illuminated, though not current matched.

In another aspect, the 3-junction tandem cell is comprised of a top (InGa)P cell, a middle (InGa)As cell and a bottom Si cell. From the AM1.5 solar spectrum we can determine that $N_1$~43.8 mA/cm$^2$, $N_2$~32.0 mA/cm$^2$, and $N_3$~16.9 mA/cm$^2$, where $N_1$ is the current density generated by photons above the silicon (bottom cell) bandgap, $N_2$ is the current density generated by photons above the GaAs (middle cell) bandgap, and $N_3$ is the current density generated by photons above the InGaP (top cell) bandgap. If these cells were stacked with equal areas, the short circuit current density of each of the subcells would ideally be 11.8 mA/cm$^2$, 15.1 mA/cm$^2$ and 16.9 mA/cm$^2$ for the silicon, GaAs and InGaP cells respectively. The efficiency obtained from this 3-junction tandem structure with 2-terminal configuration is far from optimal because the current of the 3 subcells is poorly matched. The top two cells are close to being current matched, while the silicon cell significantly limits the current and overall device performance. Traditionally, significant current mismatch has been addressed by using a 3-terminal device configuration, while modest current mismatch has been addressed by thinning down the current limiting cell to get improved performance.

Alternatively, by using the areal current matching method claimed in this filing, the same optimal performance could be obtained without having to resort to a 3-terminal configuration or having to accurately control the growth thickness of the middle and top cells with stringent requirements on their uniformity. Current matching, with the purpose of maximizing the tandem cell's overall efficiency, is achieved instead by adjusting the area of each subcell. In this case, as an illustrative example, the middle (InGa)As cell and the top (InGa)P cell are reduced together in area with respect to the bottom Si cell area, with the configuration shown in FIG. 9 and in the simulated results shown in FIG. 7 (labeled top cell area=middle cell area). In this case, the efficiency improves substantially over the value for equal cell areas, however the top and middle cells are not current matched.

Figure 7:
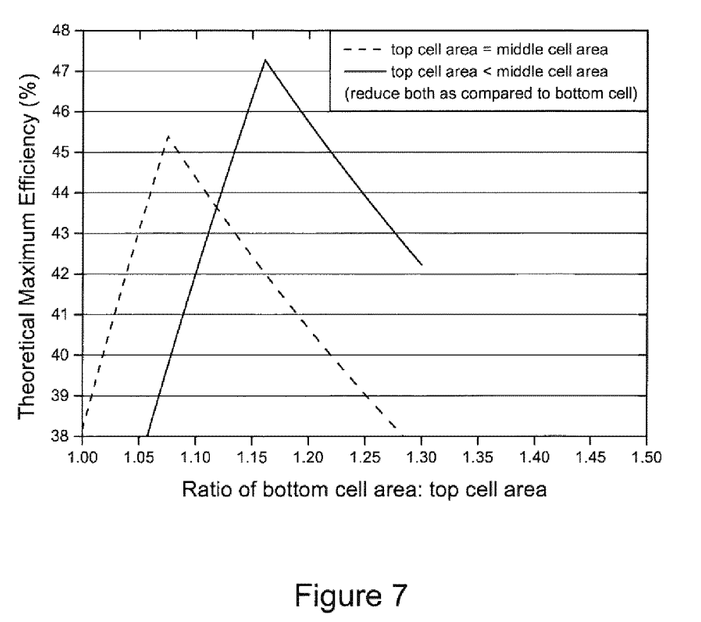
FIG. 7 is a plot which shows the 2-terminal, (InGa)P/(InGa)As/Si triple junction cell theoretical maximum efficiency as a function of areal ratio of silicon solar cell to the top (InGa)P solar cell. A higher maximum efficiency is achieved when the area of the top (InGa)P cell is smaller than the middle (InGa)As cell which is smaller than the bottom silicon cell, as compared to the case when the top (InGa)P cell and the middle (InGa)As cell areas are reduced together relative to the bottom silicon cell.

Consequently, even higher efficiency can be achieved if the middle (InGa)As cell is reduced in area with respect to the bottom Si cell area and the top (InGa)P cell is further reduced in area with respect to the middle (InGa)As cell area with the configuration shown in FIG. 10 and in the simulated results shown in FIG. 7 (labeled top cell area<middle cell area). This configuration achieves current matching between all three cells and therefore optimal efficiency for these three cell types.

For mechanically stacked and hybrid integrated solar cells, it is preferred to use proper anti-reflection methods for both cells to minimize optical losses. However, for areal current matching, the inventors note that the considerations for anti-reflection on the exposed portion of the bottom cell (or cells) are different than the considerations for anti-reflection for the overlapping regions of the two cells. In the example case given, the anti-reflection for the exposed silicon cell is most favourably designed in the same way that a single junction silicon cell is designed, since both are illuminated by the full solar spectrum.

As mentioned above, an advantage of the present invention is that it can be extended to more than two (2) cells and also each cell may be composed of more than one cell. The cells can each be composed of different materials with different bandgaps. The cells may be grown onto a particular cell in which case the subcell areas are nominally the same and connected in series electrically.

Another advantage is that areal current matching as disclosed herein can mitigate cell non-idealities such as low current from the bottom cell due to deficiencies such as material defects, design defects such as insufficient light trapping, or optical losses associated with the coupling between stacked cells.

For solar cells under concentrated illumination, in general the cell current is proportional to the illumination, while the open circuit voltage of the cell rises logarithmically with illumination. This is an added advantage for concentrator cells. In areal current matching, the inventors anticipate that the current matching condition will nominally stay the same since all the currents rise proportionally with illumination. However, due to cell non-idealities and device properties, modest adjustments are expected in the ratio of areas under concentrated light conditions. It will be appreciated by those skilled in the art that the areal current matching method disclosed herein can be used to achieve optimal efficiency for a particular level of light illumination and for a particular solar spectrum. The solar spectrum varies from terrestrial conditions to those above the earth's atmosphere and the device efficiency can be optimized for those conditions using the areal current matching method. Similarly, the solar spectrum varies with latitude, time of day and season and atmospheric conditions and the device efficiency can be optimized for those conditions using the areal current matching method disclosed herein.

It will be appreciated by those skilled in the art that the areal current matching method disclosed herein may be used alone or in combination with other known current matching methods, such as the method of controlling the top cell thicknesses.

As mentioned earlier, it will be appreciated that the present invention is not restricted to silicon or other solar cell materials disclosed herein, but it will be understood that other materials may be used so long as the bandgap requirements are satisfied as decreasing from the top solar cell to the bottom solar cell.

In summary, there is disclosed a new method for current matching of tandem solar cells, by appropriately choosing their respective areas which leads to favourable 2-terminal operation.

REFERENCES

1. Modelling of two-junction, series connected tandem solar cells using top-cell thickness as an adjustable parameter, S. R. Kurtz, P. Faine and J. M. Olson, Journal of Applied Physics 68, 1890-1895 (1990).

What is claimed is:

1. A multijunction photovoltaic device comprised of three solar cells, a bottom solar cell having an energy bandgap with $E_{g1}$, a middle solar cell having an energy bandgap with $E_{g2}$ and top solar cell having an energy bandgap $E_{g3}$, said energy bandgaps satisfying a relationship $E_{g1}<E_{g2}<E_{g3}$, said bottom solar cell, said middle solar cell and said top solar cell being vertically stacked and electrically interconnected in series in which an area of the bottom solar cell is largest, next followed by the middle solar cell and an area of the top solar cell is the smallest, such that a portion of a top surface of the bottom solar cell extends laterally beyond a bottom surface of the middle solar cell to give an exposed portion of said bottom solar cell top surface and a portion of a top surface of the middle solar cell extends laterally beyond a bottom surface of the top solar cell to give an exposed portion of the middle solar cell top surface to allow light to impinge on the exposed portion of said top surface of said middle solar cell without passing through the top solar cell, and to allow light to impinge on the exposed portion of said top surface of said bottom solar cell without passing through the top and middle solar cells, and in which the area of the bottom solar cell is larger than the area of the middle solar cell and the area of the middle solar cell is larger than the area of the top solar cell in an appropriate ratio to provide for a substantially current matched photovoltaic device for operation in a 2-terminal configuration.

2. The multijunction photovoltaic device of claim 1, wherein the bottom solar cell is a silicon based solar cell.

3. The multijunction photovoltaic device of claim 1, where the top solar cell has a bandgap between 1.7 and 1.9 eV.

4. The multijunction photovoltaic device of claim 1, where the middle solar cell has a bandgap between 1.3 and 1.5 eV.

5. The multijunction photovoltaic device of claim 1, wherein the solar cells are combined to give electrical, optical and mechanical connection between the solar cells, said solar cells being combined using any one or combination of direct growth, direct bonding and bonding via an intermediate metal or any conducting material, such that the intermediate sheet resistance is less than about 1 Ohm-cm$^2$.

6. The multijunction photovoltaic device of claim 1, wherein a top surface of the bottom and/or middle solar cell has an anti-reflection coating or surface treatment.

7. The multijunction photovoltaic device of claim 1, wherein a bottom surface of the middle and/or top solar cell has an anti-reflection coating or surface treatment.

8. The multijunction photovoltaic device of claim 1, wherein a region between the top and middle cells and/or between the middle and bottom cells is designed to minimize reflection losses by suitable choice of intervening materials, having selected indices of refraction and their thickness.

9. The multijunction photovoltaic device of claim 1, wherein said top solar cell includes two or more top subcells vertically stacked, wherein said middle solar cell includes two or more middle subcells vertically stacked, and said bottom solar cells includes two or more bottom subcells vertically stacked, wherein an area of each cell is chosen to obtain a maximum energy conversion efficiency for the multijunction photovoltaic device.

10. The multijunction photovoltaic device according to claim 9 wherein the top subcells have the same area and decreasing bandgaps towards the bottom solar cell with any number of subcells, and wherein the middle subcells have the same area and decreasing bandgaps towards the bottom solar cell with any number of subcells, and wherein the bottom subcells have the same area and decreasing bandgaps towards a bottommost bottom subcell, the bottom solar cell having any number of subcells.

11. The multijunction photovoltaic device according to claim 1, wherein the top cell is (InGa)P.

12. The multijunction photovoltaic device according to claim 1, wherein the middle cell is (InGa)As.

* * * * *

UNITED STATES PATENT AND TRADEMARK OFFICE
CERTIFICATE OF CORRECTION

| | |
|---|---|
| PATENT NO. | : 10,084,106 B2 |
| APPLICATION NO. | : 14/115128 |
| DATED | : September 25, 2018 |
| INVENTOR(S) | : Rafael Kleiman et al. |

It is certified that error appears in the above-identified patent and that said Letters Patent is hereby corrected as shown below:

In the Specification

Column 4, Line 48, "a/showed" should be --al showed--.

Column 6, Line 6, "eta/could" should be --et al could--.

Signed and Sealed this
Sixth Day of November, 2018

Andrei Iancu
*Director of the United States Patent and Trademark Office*